(12) United States Patent
Heason et al.

(10) Patent No.: US 10,487,659 B2
(45) Date of Patent: Nov. 26, 2019

(54) ADDITIVE LAYER REPAIR OF A METALLIC COMPONENT

(71) Applicant: ROLLS-ROYCE plc, London (GB)

(72) Inventors: Christopher P Heason, Chesterfield (GB); Gavin J Baxter, Sheffield (GB)

(73) Assignee: ROLLS-ROYCE plc, London (GB)

( * ) Notice: Subject to any disclaimer, the term of this patent is extended or adjusted under 35 U.S.C. 154(b) by 264 days.

(21) Appl. No.: 15/154,474

(22) Filed: May 13, 2016

(65) Prior Publication Data

US 2016/0341044 A1 Nov. 24, 2016

(30) Foreign Application Priority Data

May 21, 2015 (GB) .................................. 1508703.4

(51) Int. Cl.

| | | |
|---|---|---|
| *F01D 5/00* | (2006.01) | |
| *B23P 6/00* | (2006.01) | |
| *B23K 26/342* | (2014.01) | |
| *C23C 16/44* | (2006.01) | |
| *C23C 16/48* | (2006.01) | |
| *F01D 5/02* | (2006.01) | |
| *F01D 5/14* | (2006.01) | |

(Continued)

(52) U.S. Cl.
CPC .......... *F01D 5/005* (2013.01); *C23C 16/4417* (2013.01); *C23C 16/483* (2013.01); *F01D 5/02* (2013.01); *F01D 5/147* (2013.01); *F01D 11/00* (2013.01); *F05D 2220/32* (2013.01); *F05D 2230/80* (2013.01); *F05D 2300/10* (2013.01)

(58) Field of Classification Search
CPC ........................... F01D 5/005; C23C 16/4417
See application file for complete search history.

(56) References Cited

U.S. PATENT DOCUMENTS

| | | | | |
|---|---|---|---|---|
| 5,038,014 A | * | 8/1991 | Pratt ..................... | B22F 3/1055 |
| | | | | 219/121.64 |
| 6,146,714 A | * | 11/2000 | Beyer ................... | C23C 14/046 |
| | | | | 427/230 |

(Continued)

FOREIGN PATENT DOCUMENTS

| | | |
|---|---|---|
| EP | 1 743 729 A2 | 1/2007 |
| EP | 2 025 777 A2 | 2/2009 |

(Continued)

OTHER PUBLICATIONS

Oct. 28, 2015 Search Report issued in British Patent Application No. GB1508703.4.

(Continued)

*Primary Examiner* — Liam J Heincer
(74) *Attorney, Agent, or Firm* — Oliff PLC

(57) ABSTRACT

A method of repairing a metallic component (formed from a first material) by powder feeding laser deposition, comprises the step of depositing a plurality of first repair layers onto a repair surface of the component to form a first repair zone, the first of the plurality of first repair layers comprising a mixture of A/B by weight of the first material and a second material, each nth successive one of the plurality of first repair layers comprising a change in the proportion of the second material in the mixture, the last of the plurality of first repair layers comprising a mixture of C/D by weight of the first material and the second material.

18 Claims, 9 Drawing Sheets

(51) Int. Cl.
*F01D 11/00* (2006.01)
*B23K 35/02* (2006.01)
*C23C 24/10* (2006.01)
*B23K 35/28* (2006.01)
*B23K 35/30* (2006.01)
*B23K 35/32* (2006.01)
*B23K 101/00* (2006.01)

(56) References Cited

U.S. PATENT DOCUMENTS

| | | | |
|---|---|---|---|
| 6,269,540 B1 * | 8/2001 | Islam | B23K 26/0604 29/402.18 |
| 7,020,539 B1 | 3/2006 | Kovacevic et al. | |
| 2003/0077221 A1 * | 4/2003 | Chiruvolu | B82Y 30/00 423/625 |
| 2007/0003416 A1 * | 1/2007 | Bewlay | B22F 5/009 416/241 B |
| 2008/0178994 A1 * | 7/2008 | Qi | B22F 3/1055 156/245 |
| 2009/0028697 A1 * | 1/2009 | Shi | F01D 5/147 415/200 |
| 2009/0057275 A1 * | 3/2009 | Chen | B22F 7/064 219/76.1 |
| 2009/0162207 A1 * | 6/2009 | Peters | B23K 26/10 416/224 |
| 2009/0280269 A1 * | 11/2009 | Bewlay | B22F 5/009 427/596 |
| 2011/0226390 A1 * | 9/2011 | Chen | C22C 19/00 148/527 |
| 2012/0000890 A1 * | 1/2012 | Ito | B23P 6/007 219/76.1 |
| 2013/0091704 A1 * | 4/2013 | Nebesni | B23K 26/0823 29/889.1 |
| 2013/0140278 A1 | 6/2013 | Bruck et al. | |
| 2014/0220374 A1 | 8/2014 | Bruck et al. | |
| 2014/0248512 A1 * | 9/2014 | Kamel | C23C 28/021 428/686 |
| 2014/0255198 A1 | 9/2014 | El-Wardany et al. | |
| 2014/0295087 A1 * | 10/2014 | Rickenbacher | B22F 3/1055 427/383.1 |
| 2015/0030871 A1 | 1/2015 | Bruck et al. | |
| 2015/0044084 A1 * | 2/2015 | Hofmann | B32B 15/01 419/7 |
| 2016/0243650 A1 * | 8/2016 | Lin | F01D 5/005 |

FOREIGN PATENT DOCUMENTS

| | | |
|---|---|---|
| EP | 2 502 729 A1 | 9/2012 |
| EP | 2 586 548 A1 | 5/2013 |
| EP | 2 815 823 A1 | 12/2014 |
| EP | 2 839 905 A1 | 2/2015 |
| EP | 2 865 465 A1 | 4/2015 |
| WO | 2010/008633 A2 | 1/2010 |
| WO | 2013/087515 A1 | 6/2013 |
| WO | 2015/119822 A1 | 8/2015 |

OTHER PUBLICATIONS

Oct. 5, 2016 Search Report issued in European Patent Application No. 16 16 9613.

Sep. 2, 2016 Search Report issued in Great Britain Patent Application No. 1508703.4.

* cited by examiner

ADDITIVE LAYER REPAIR OF A METALLIC COMPONENT

This disclosure claims the benefit of UK Patent Application No. GB1508703.4, filed on 21 May 2015, which is hereby incorporated herein in its entirety.

FIELD OF THE DISCLOSURE

The present disclosure relates to a method for additive layer repair of a metallic component and particularly, but not exclusively, to a method for additive layer repair of an aerofoil for a gas turbine engine.

BACKGROUND TO THE DISCLOSURE

The ability to operate gas turbine engines at higher temperatures improves the efficiency of the engine. This higher temperature operation requires the use of high performance materials such as special steels, titanium alloys and Superalloys. In order to obtain the required material characteristics, these materials are often forged and age hardened.

Due to the high value of such components, there is a need to be able to repair them when they become damaged in service, for example due to the ingestion of debris into the engine.

One technique for the repair of such components is additive layer repair using a blown powder addition process. FIG. 1 shows a schematic illustration of such a process in which a deposition nozzle 10 is used to direct a flow of powder 20 onto a layered build surface 30. The powder may also be added off-axis to the main laser beam delivery. The deposited powder is then simultaneously melted into the weldpool using a directed laser beam 40. In this arrangement, the deposition nozzle 10 is fed with a supply of the powdered repair material 50. As the powder addition nozzle and laser moves away from the deposit area the meltpool created by the laser solidifies behind it.

It is normally desired that the repaired area of the component has mechanical properties that are at least equal to those of the original component. This in turn requires the repair process to be able to create a cast material having at least equal properties to the forged and sometimes age hardened base material.

For some materials this is known to be difficult, if not impossible, to achieve using a conventional blown powder additive layer repair technique.

STATEMENTS OF DISCLOSURE

According to a first aspect of the present disclosure there is provided a method of repairing a metallic component by powder feeding laser deposition, the metallic component being formed from a first material, the method comprising the step of:

depositing a plurality of first repair layers onto a repair surface of the component to form a first repair zone, the first of the plurality of first repair layers comprising a mixture of A/B by weight of the first material and a second material, each nth successive one of the plurality of first repair layers comprising a change in the proportion of the second material in the mixture, the last of the plurality of first repair layers comprising a mixture of C/D by weight of the first material and the second material.

The first repair zone is formed from a large number of first repair layers, each of which comprises a blend of the first material of which the metallic component is formed, and the second material being the repair material. The ratio of first material to second material changes through the thickness of the first repair zone.

This graded change in the proportion of the second material in the first repair layers prevents the formation of intermetallic compounds, inhibits the formation of cracks, and prevents geometrical distortion across the first repair zone.

Optionally, the integer 'n' is selected from the range comprising 10 to 1,000.

The rate at which the proportion of second material in each first repair layer changes can be controlled by varying the integer 'n'.

Optionally, the ratio A/B is selected from the range comprising 80/20 to 5/95.

In the arrangement of the disclosure, the initial first repair layer comprises a proportion of 20% by weight of the second material.

Optionally, the ratio C/D is selected from the range comprising 0/100 to 40/60.

In one embodiment, the final one of the first repair layers is composed entirely of the second material. In other arrangements, the proportion of the final first repair layer that is formed by the first material may be up to 40%.

Optionally, the change in the proportion of the second material in the mixture comprises an increase in the proportion of the second material in the mixture.

In one arrangement, the change in the proportion of the second material in the mixture is a monotonic increase in the proportion of the second material in the mixture.

In other arrangements, the change in proportion of the second material in the mixture may be a nonlinear increase, a monotonic decrease, or a nonlinear decrease in the proportion of the second material in the mixture.

Optionally, the method comprises the additional step of:
depositing a plurality of second repair layers of the second material onto the first repair zone to form a second repair zone.

The second repair zone forms a further discrete layer superposed on the first repair zone. The second repair zone is composed solely of the second material.

In this arrangement, the first repair zone acts as an intermediate, or buffer, zone between the first material of the metallic component and the second material of the second repair zone. The graded through thickness composition of the first repair zone prevents a mismatch in geometry, metallurgy or properties between the first material of the metallic component and the second material of the second repair zone.

Optionally, the method comprises the additional step of:
depositing a plurality of third repair layers of a third material onto the second repair zone to form a third repair zone.

In this arrangement, the second material acts as a buffer layer between the first material of the metallic component and the third material being a main repair material.

In this arrangement, the second material is selected such that it can be independently welded to each of the first material and the third material. Furthermore, the second material is selected such that it can equalise differences in thermal and mechanical properties between the first material and the third material.

Optionally, the third material is metallurgically compatible with both the first material and the second material.

The third material is selected so as to readily alloy with both the first material and the second material. This ensures that the repaired metallic component has mechanical properties that are at least equal to those of the first material, i.e. that of the original metallic component itself.

Optionally, the first material and the second material have the same metallurgical composition.

Optionally, the first material is metallurgically compatible with the second material.

The first material is selected so as to readily alloy with the second material. This ensures that the repaired metallic component has mechanical properties that are at least equal to those of the first material, i.e. that of the original metallic component itself.

Optionally, the metallic component is a bladed disc for a gas turbine engine.

In other embodiments of the disclosure, the metallic component may be a bladed ring for a gas turbine engine, or an individual aerofoil for a turbine or compressor of a gas turbine engine Alternatively, the metallic component may be a seal segment for a gas turbine engine.

Optionally, the first material is provided as a powder having a first mean particle size, and the second material is provided as a powder having a second mean particle size, and if the first mean particle size is smaller than the second mean particle size, then for the same volume of material, the time required to melt the first material will be less than the time required to melt the second material, otherwise if the second mean particle size is smaller than the first mean particle size, then for the same volume of material, the time required to melt the second material will be less than the time required to melt the first material.

The second material may have a significantly different melting temperature range to that of the first material. By differentially selecting the particle size for each of the first material and the second material, it is possible to prevent the particles of the higher melting point powder from being unmelted or only partially melted. This differential selection of particle size also prevents the particles of the lower melting point powder from being vapourised, which would not only change the alloy chemistry, but would also cause turbulent melt pool flow potentially resulting in void defects.

By specifying a fine powder particle size distribution for the high melting point powder alloy, the increased surface area would reduce the time required at temperature to melt the same volume of material. Similarly the low melting temperature powder may require a coarser powder particle size range to increase the time required to melt the same volume and reduce vaporisation of the alloy.

In an alternative arrangement the metallic component may have particular property requirements that place a restriction on the local presence of features such as porosity. Powders with a smaller particle size distribution are known to result in smaller volume fraction porosity in the deposited part. However, such smaller particle size powders are also more costly to manufacture.

The selection of particle size enables the more expensive smaller particle size powder to be used at specific locations where high integrity is required. Less expensive powder with a larger particle size distribution can then be used for the remainder of the material deposition process leading to a more cost effective repair.

Optionally, the second material is provided as a powder having a second mean particle size, and the third material is provided as a powder having a third mean particle size, and if the second mean particle size is smaller than the third mean particle size, then for the same volume of material, the time required to melt the second material will be less than the time required to melt the third material, otherwise if the third mean particle size is smaller than the second mean particle size, then for the same volume of material, the time required to melt the third material will be less than the time required to melt the second material.

The selection of particle sizes for the second and third materials leads to the same advantages as those described above in relation to the first and second materials.

According to a second aspect of the present disclosure there is provided a method of repairing a metallic component by powder feeding laser deposition, the metallic component being formed from a first material, the method comprising the step of:

depositing a plurality of second repair layers of a second material onto a repair surface of the component to form a second repair zone; and depositing a plurality of third repair layers of a third material onto the second repair zone to form a third repair zone.

In this arrangement, the second material takes the form of a buffer material interposed between the first material, being the base material, and the third material, being the repair material.

According to a third aspect of the present disclosure there is provided a metallic component comprising:

a base region formed from a first material; and a first repair zone superposed on the base region, the first repair zone being formed from a plurality of first repair layers, the first of the plurality of first repair layers comprising a mixture of A/B by weight of the first material and a second material, each nth successive one of the plurality of first repair layers comprising an increase in the proportion of the second material in the mixture, the last of the plurality of first repair layers comprising a mixture of C/D by weight of the first material and the second material.

The presence of a graded first repair zone superposed on the base region of the metallic component provides for a repaired region (the first repair zone) that has material properties that are at least equal to those of the first material.

Optionally, the integer 'n' is selected from the range comprising 10 to 1,000.

The rate at which the proportion of second material in each first repair layer changes, may be controlled by varying the integer 'n'.

Optionally, the ratio A/B is selected from the range comprising 80/20 to 5/95.

In the arrangement of the disclosure, the initial first repair layer comprises a proportion of 20% by weight of the second material.

Optionally, the ratio C/D is selected from the range comprising 0/100 to 40/60.

In one embodiment, the final one of the first repair layers is composed entirely of the second material. In other arrangements, the proportion of the final first repair layer that is formed by the first material may be up to 40%.

Optionally, the change in the proportion of the second material in the mixture comprises an increase in the proportion of the second material in the mixture.

In one arrangement, the change in the proportion of the second material in the mixture is a monotonic increase in the proportion of the second material in the mixture.

In other arrangements, the change in proportion of the second material in the mixture may be a nonlinear increase, a monotonic decrease, or a nonlinear decrease in the proportion of the second material in the mixture.

Optionally, the metallic component further comprises:
a second repair zone superposed on the first repair zone, the second repair zone comprising a plurality of second repair layers of the second material.

The second repair zone forms a further discrete layer superposed on the first repair zone. The second repair zone is composed solely of the second material.

In this arrangement, the first repair zone acts as an intermediate, or buffer, zone between the first material of the metallic component and the second material of the second repair zone. The graded through thickness composition of the first repair zone prevents a mismatch in geometry, metallurgy or properties between the first material of the metallic component and the second material of the second repair zone.

Optionally, the metallic component further comprises:
a third repair zone superposed on the second repair zone, the third repair zone comprising a plurality of third repair layers of a third material.

In this arrangement, the second material acts as a buffer layer between the first material of the metallic component and the third material being a main repair material.

In this arrangement, the second material is selected such that it can be independently welded to each of the first material and the third material. Furthermore, the second material is selected such that it can equalise differences in thermal and mechanical properties between the first material and the third material.

Other aspects of the disclosure provide devices, methods and systems which include and/or implement some or all of the actions described herein. The illustrative aspects of the disclosure are designed to solve one or more of the problems herein described and/or one or more other problems not discussed.

BRIEF DESCRIPTION OF THE DRAWINGS

There now follows a description of an embodiment of the disclosure, by way of non-limiting example, with reference being made to the accompanying drawings in which.

It is noted that the drawings may not be to scale. The drawings are intended to depict only typical aspects of the disclosure, and therefore should not be considered as limiting the scope of the disclosure. In the drawings, like numbering represents like elements between the drawings.

DETAILED DESCRIPTION

The method of repairing a metallic component is described below with reference to the metallic component being a gas turbine engine compressor bladed disc.

Figure 2:
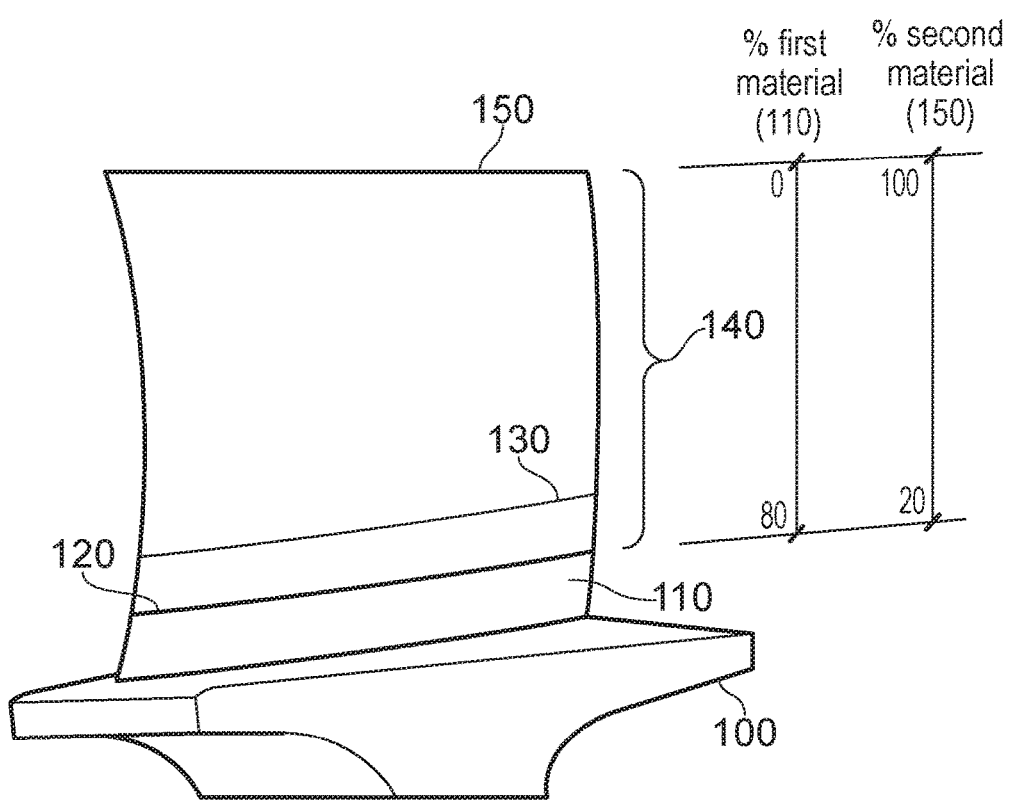
FIG. 2 shows a perspective view of a repaired metallic component according to a first embodiment of the disclosure.

Referring to FIG. 2, a repaired metallic component that has been repaired according to a first embodiment of the disclosure is designated generally by the reference numeral 100.

The metallic component 100 is formed from a first material 110 and has a first repair surface 120. In the present arrangement, the first material would typically be a titanium, nickel, special steel or aluminium alloy.

In the method of the first embodiment of the disclosure, a powder feeding laser deposition technique is employed to deposit a plurality of first repair layers 130 onto the first repair surface 110. The plurality of the first repair layers 130 together forms a first repair zone 140.

The first one of the plurality of first repair layers 130 is comprised of a mixture of A/B, by weight, of the first material 110 and a second material 150 respectively. In this first repair layer 130, the proportion A made up of the first material is 80% by weight, while the proportion B made up of the second material is 20% by weight.

In the present arrangement, the second material 150 is typically a titanium, nickel, special steel or aluminium alloy In other arrangements, the composition of the first repair layer 130 may vary between 80% A and 20% B, and 5% A and 95% B.

Each of the plurality of the first repair layers 130 is between approximately 100-1000 μm in thickness, this being typical of the thickness of a layer of material produced by the powder feeding laser deposition technique.

Each $n^{th}$ successive one of the plurality of first repair layers 130 comprises a change in the proportion of the second material 150 in the respective first repair layer 130. In the present embodiment of the method, the integer 'n' is 10. In other words, at every $10^{th}$ successive first repair layer the ratio of the first material 110 to the second material 150 changes. In the present embodiment, this change is a monotonic increase in the proportion of the second material 150 in the composition of the respective first repair layer 130.

The first repair zone 140 thus comprises a graded composition that starts from 80% A and 20% B at the first of the first repair layers 130 and gradually changes, as outlined above, and finishes with the last of the first repair layers 130 having a composition of 0% A and 100% B.

Figure 3:
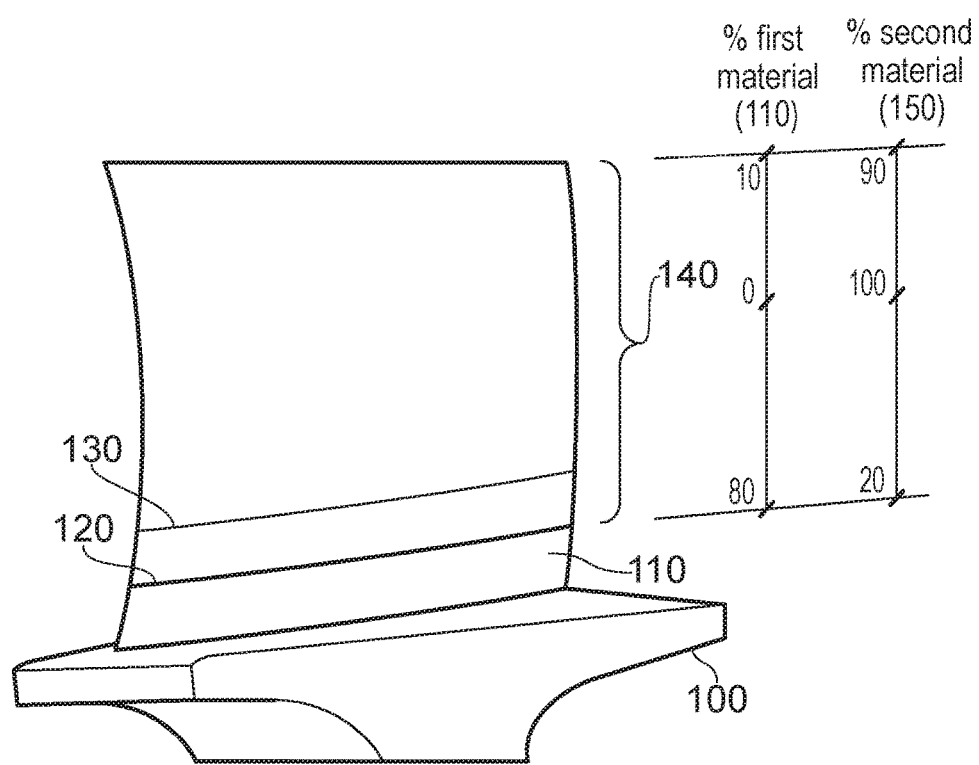
FIG. 3 shows a perspective view of an alternative arrangement of the repaired metallic component of FIG. 2.

FIG. 3 shows a repaired metallic component that has been repaired according to a variant of the first embodiment of the disclosure. The repaired metallic component is again designated generally by the reference numeral 100.

In this arrangement, the first repair zone 140 comprises a plurality of first repair layers 130. However, in this arrangement, the change in the proportion of the second material 150 in each of the first repair layers 130 is not always a monotonic increase in the proportion of the second material 150.

In the example of FIG. 3, the proportion of the first repair layers 130 that is comprised of the second material 150 increases steadily from the first of the first repair layers 130 (i.e. at the first repair surface 120) through to a point mid-way through the thickness of the first repair zone 140.

At this mid-way point, the proportion of the first repair layers 130 that is comprised of the second material 150 decreases steadily through to the last one of the first repair layers 130.

Figure 4:
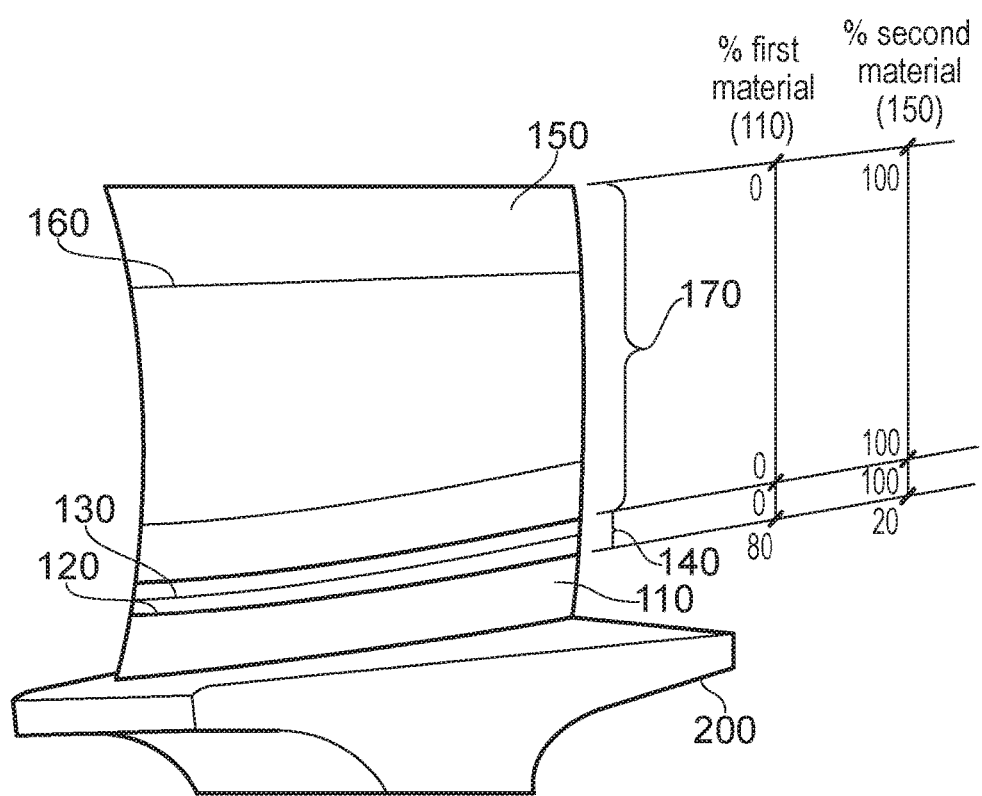
FIG. 4 shows a perspective view of a repaired metallic component according to a second embodiment of the disclosure.

Referring to FIG. 4, a repaired metallic component according to a second embodiment of the disclosure is designated generally by the reference numeral 200. Features of the repaired metallic component 200 which correspond to those of the repaired metallic component 100 have been given corresponding reference numerals for ease of reference.

The repaired metallic component 200 comprises a plurality of first repair layers 130 that are deposited onto the repair surface 120 to form a first repair zone 140.

This first repair zone 140 may comprise a monotonically graded change in composition of the first repair layers 130 through the thickness of the first repair zone 140, as outlined above in relation to the repaired metallic component 100.

The repaired metallic component 200 further comprises a plurality of second repair layers 160 deposited onto the first repair zone 140 to form a second repair zone 170.

In the embodiment of FIG. 4, each of the second repair layers 160 is composed only of the second material 150, such that the second repair zone 170 is formed entirely of the second material 150.

Figure 5:
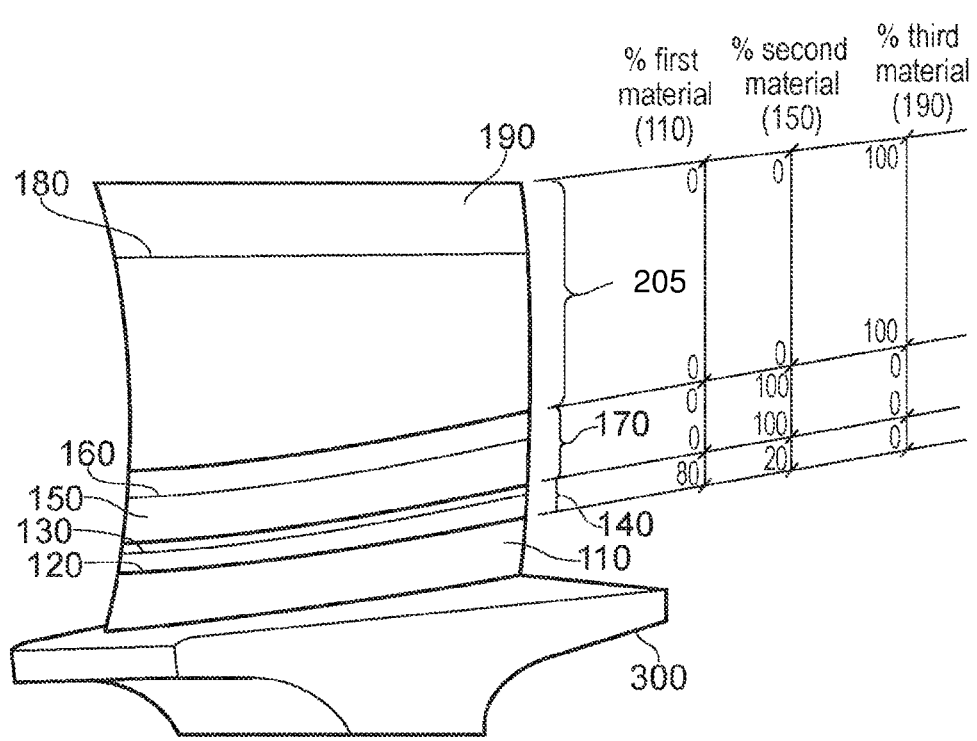
FIG. 5 shows a perspective view of a repaired metallic component according to a third embodiment of the disclosure.

Referring to FIG. 5, a repaired metallic component according to a third embodiment of the disclosure is designated generally by the reference numeral 300. Features of the repaired metallic component 300 which correspond to those of the repaired metallic component 100 have been given corresponding reference numerals for ease of reference.

The repaired metallic component 300 comprises a plurality of first repair layers 130 that are deposited onto the repair surface 120 to form a first repair zone 140.

This first repair zone 140 may comprise a monotonically graded change in composition of the first repair layers 130 through the thickness of the first repair zone 140, as outlined above in relation to the repaired metallic component 100.

The repaired metallic component 300 further comprises a plurality of second repair layers 160 deposited onto the first repair zone 140 to form a second repair zone 170.

The repaired metallic component 300 still further comprises a plurality of third repair layers 180 deposited onto the second repair zone 170 to form a third repair zone 205.

In the embodiment of FIG. 5, each of the second repair layers 160 is composed only of the second material 150, such that the second repair zone 170 is formed entirely of the second material 150, and each of the third repair layers 180 is composed only of the third material 190, such that the third repair zone 205 is formed entirely of the third material 190.

Figure 6:
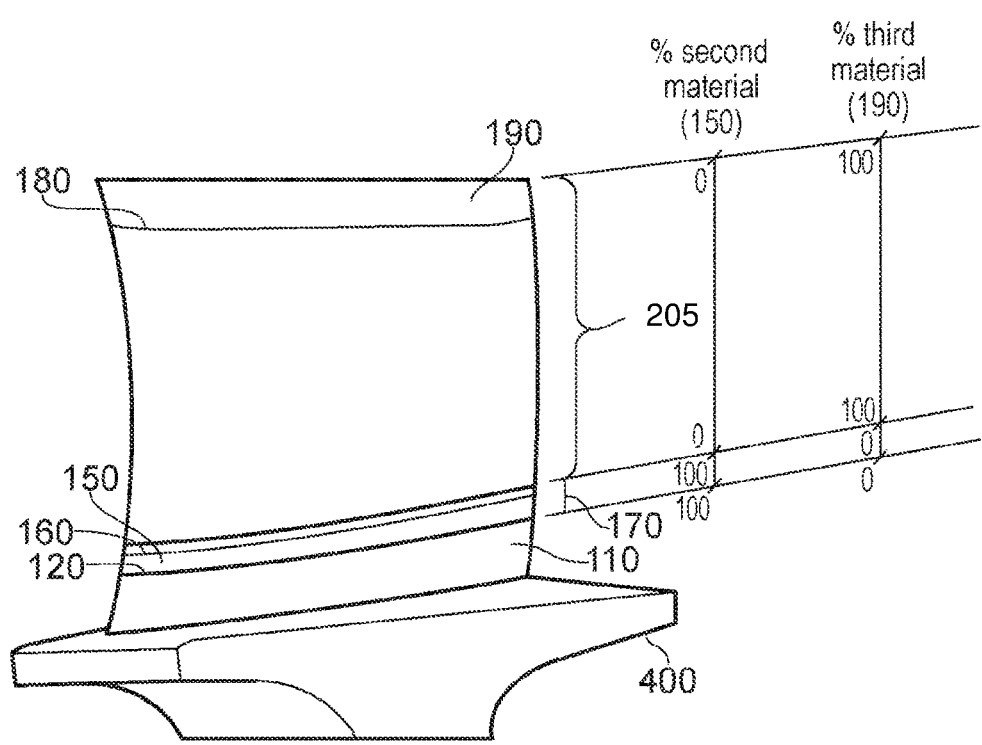
FIG. 6 shows a perspective view of a repaired metallic component according to a fourth embodiment of the disclosure.

Referring to FIG. 6, a repaired metallic component according to a fourth embodiment of the disclosure is designated generally by the reference numeral 400. Features of the repaired metallic component 400 which correspond to those of the repaired metallic component 100 have been given corresponding reference numerals for ease of reference.

The repaired metallic component 400 comprises a plurality of second repair layers 160 that are deposited onto the repair surface 120 to form a second repair zone 170.

The repaired metallic component 400 further comprises a plurality of third repair layers 180 deposited onto the second repair zone 170 to form a third repair zone 205.

In the embodiment of FIG. 6, each of the second repair layers 160 is composed only of the second material 150, such that the second repair zone 170 is formed entirely of the second material 150, and each of the third repair layers 180 is composed only of the third material 190, such that the third repair zone 205 is formed entirely of the third material 190.

Figure 7:
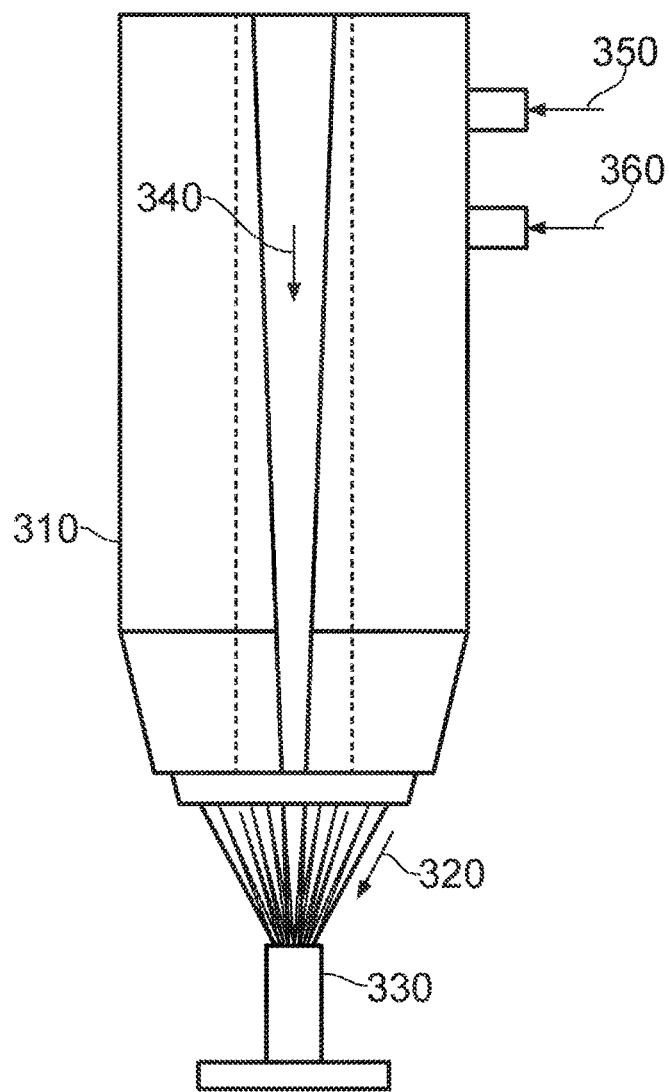
FIG. 7 shows a schematic sectional view of a blown powder additive layer repair process for implementing the method of the disclosure.

FIG. 7 shows a schematic arrangement of a modified powder feeding laser deposition process capable of performing the method of the present disclosure as outlined above in relation to the first and second embodiments of the disclosure.

In the arrangement of FIG. 7, each of the first material 110 and the second material 150 is delivered to the deposition nozzle 310 via separate powder feeds 350, 360 respectively.

The flow of powder through each powder feed 350,360 can be independently adjusted to change the powder composition slow 320 directed on to the layered build surface 330. This change in the powder composition is implemented automatically in the deposition programme operating code. The deposition software allows the method to vary the composition of the first repair layers 130 to achieve the graded layer composition as outlined above.

The software may also use material data to compensate for different material densities and particle size distributions in order to maintain an accurate powder feed ratio in order to deliver the grading that is required.

Figure 8:
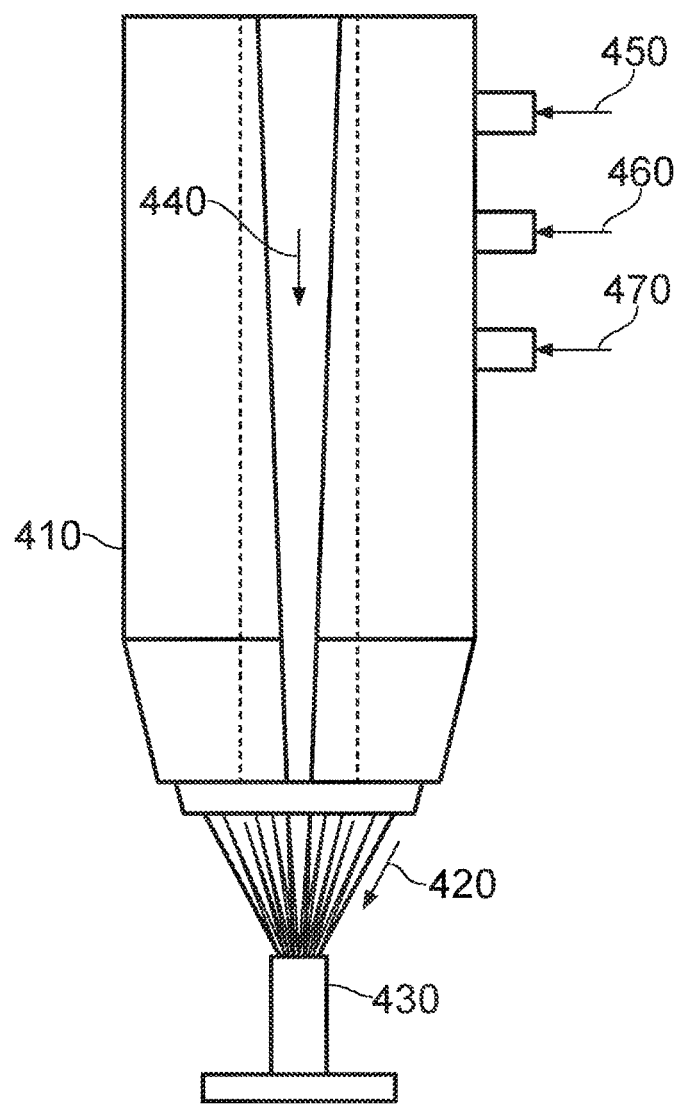
FIG. 8 shows a schematic sectional view of an alternative blown powder additive layer repair process for implementing the method of the disclosure.

FIG. 8 shows a variant of the modified process shown in FIG. 7 that has been adapted to perform the method of the present disclosure as outlined above in relation to the third and fourth embodiments of the disclosure.

FIG. 8 differs from FIG. 7 in the addition of another powder feed 470 (in addition to powder feeds 450 and 460) to deliver the third material 190.

Figure 1:
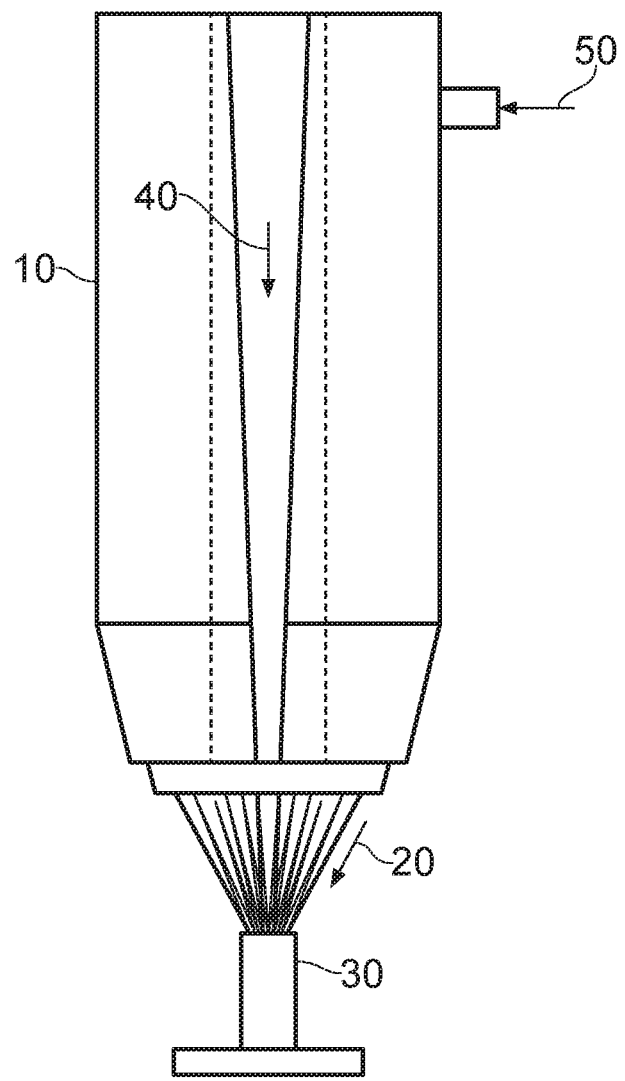
FIG. 1 shows a schematic sectional view of a blown powder additive layer repair process according to the prior art.
Figure 9:
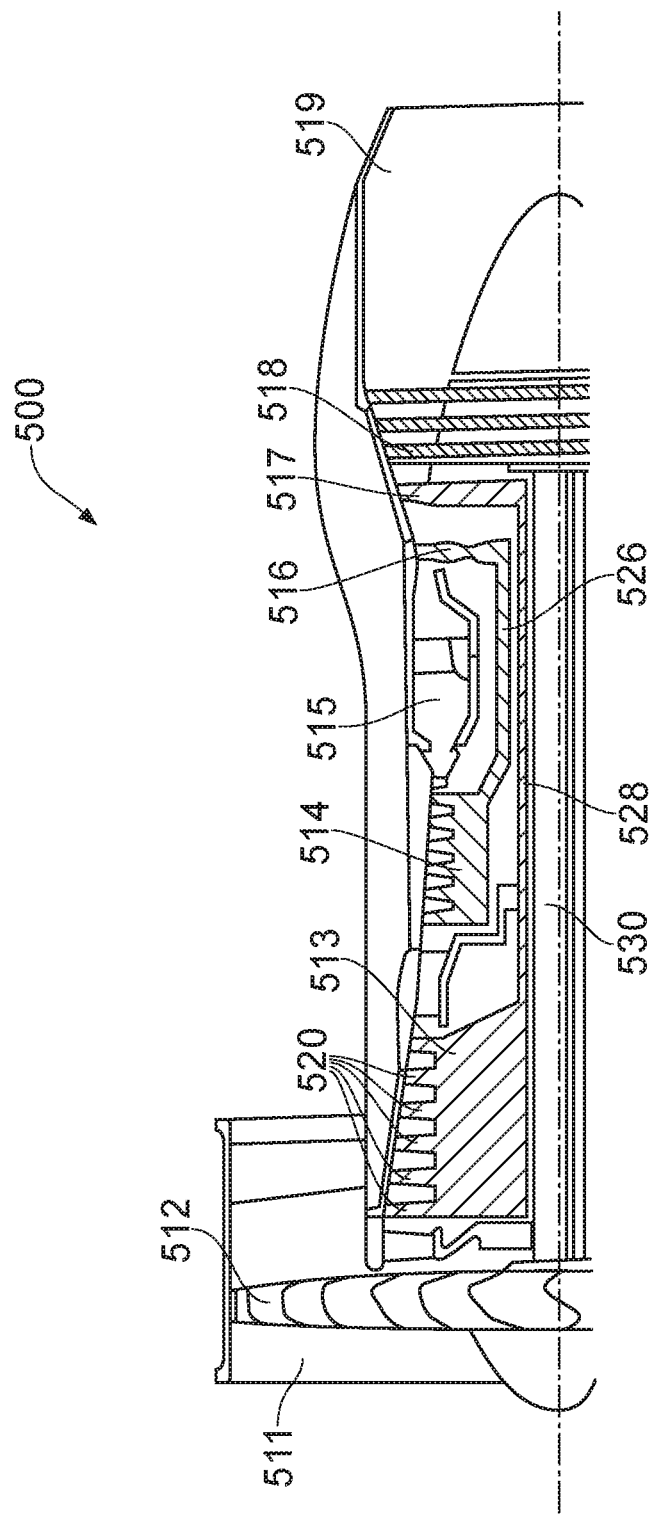
FIG. 9 shows a schematic sectional view of a gas turbine engine incorporating a repaired metallic component according to an embodiment of the disclosure.

FIG. 9 shows a schematic sectional view of a turbofan engine 500. The turbofan gas turbine engine 500, as shown in FIG. 1, comprises in flow series an intake 511, a fan 512, an intermediate pressure compressor 513, a high pressure compressor 514, a combustion chamber 515, a high pressure turbine 516, an intermediate pressure turbine 517, a low pressure turbine 518 and an exhaust 519. The high pressure turbine 516 is arranged to drive the high pressure compressor 514 via a first shaft 526. The intermediate pressure turbine 517 is arranged to drive the intermediate pressure compressor 513 via a second shaft 528 and the low pressure turbine 518 is arranged to drive the fan 512 via a third shaft 530. In operation air flows into the intake 511 and is compressed by the fan 512. A first portion of the air flows through, and is compressed by, the intermediate pressure compressor 513 and the high pressure compressor 514 and is supplied to the combustion chamber 515. Fuel is injected into the combustion chamber 515 and is burnt in the air to produce hot exhaust gases which flow through, and drive, the high pressure turbine 516, the intermediate pressure turbine 517 and the low pressure turbine 518. The hot exhaust gases leaving the low pressure turbine 518 flow through the exhaust 519 to provide propulsive thrust. A second portion of the air bypasses the main engine to provide propulsive thrust.

In the arrangement of FIG. 9, each of the stages of the intermediate pressure compressor 513 is formed as a bladed disc 520 that has been repaired according to a method of the present disclosure as outlined above.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person of skill in the art are included within the scope of the disclosure as defined by the accompanying claims.

What is claimed is:

1. A method of repairing a metallic component by powder feeding laser deposition, the metallic component being formed from a first material, the method comprising depositing a plurality of first repair layers onto a repair surface of the component to form a first repair zone, the first of the plurality of first repair layers comprising a mixture of A/B by weight of the first material and a second material, each $n^{th}$ successive one of the plurality of first repair layers comprising a change in the proportion of the second material in the mixture, the last of the plurality of first repair layers comprising a mixture of C/D by weight of the first material and the second material,
wherein the first material consists of at least one selected from the group consisting of a titanium alloy, a nickel alloy, a special steel and an aluminum alloy,
the first material is provided as a powder having a first mean particle size, and the second material is provided as a powder having a second mean particle size,
a distribution of the first mean particle size and the second mean particle size varies across the first repair zone in a thickness direction,
if the first mean particle size is smaller than the second mean particle size, then, for the same volume of material, a time required to melt the first material will be less than a time required to melt the second material, and
if the second mean particle size is smaller than the first mean particle size, then, for the same volume of material, the time required to melt the second material will be less than the time required to melt the first material.

2. The method as claimed in claim 1, wherein the integer 'n' is in a range of 10 to 1,000.

3. The method as claimed in claim 1, wherein a ratio A/B is in a range of 80/20 to 5/95.

4. The method as claimed in claim 1, wherein a ratio C/D is in a range of 0/100 to 40/60.

5. The method as claimed in claim 1, wherein the change in the proportion of the second material in the mixture comprises an increase in the proportion of the second material in the mixture.

6. The method as claimed in claim 1, the method further comprising depositing a plurality of second repair layers of the second material onto the first repair zone to form a second repair zone.

7. The method as claimed in claim 6, the method further comprising depositing a plurality of third repair layers of a third material onto the second repair zone to form a third repair zone.

8. The method as claimed in claim 7, wherein the third material is metallurgically compatible with both the first material and the second material.

9. The method as claimed in claim 7, wherein if the second mean particle size is smaller than the third mean particle size, then, for the same volume of material, the time required to melt the second material will be less than the time required to melt the third material, and
if the third mean particle size is smaller than the second mean particle size, then, for the same volume of material, the time required to melt the third material will be less than the time required to melt the second material.

10. The method as claimed in claim 1, wherein the first material and the second material have the same metallurgical composition.

11. A method of repairing a metallic component by powder feeding laser deposition, the metallic component being formed from a first material, the method comprising:
depositing a plurality of second repair layers of a second material onto a repair surface of a first repair zone of the component to form a second repair zone; and
depositing a plurality of third repair layers of a third material onto the second repair zone to form a third repair zone,
wherein the first material consists of at least one selected from the group consisting of a titanium alloy, a nickel alloy, a special steel and an aluminum alloy,
the first material is provided as a powder having a first mean particle size, and the second material is provided as a powder having a second mean particle size,
a distribution of the first mean particle size and the second mean particle size varies across the first repair zone in a thickness direction,
if the first mean particle size is smaller than the second mean particle size, then, for the same volume of material, a time required to melt the first material will be less than a time required to melt the second material, and
if the second mean particle size is smaller than the first mean particle size, then, for the same volume of material, the time required to melt the second material will be less than the time required to melt the first material.

12. A metallic component comprising:
a base region formed from a first material; and
a first repair zone superposed on the base region, the first repair zone being formed from a plurality of first repair layers, the first of the plurality of first repair layers comprising a mixture of A/B by weight of the first material and a second material, each $n^{th}$ successive one of the plurality of first repair layers comprising a change in the proportion of the second material in the mixture, the last of the plurality of first repair layers comprising a mixture of C/D by weight of the first material and the second material,
wherein the first material consists of at least one selected from the group consisting of a titanium alloy, a nickel alloy, a special steel and an aluminum alloy,
the first material is provided as a powder having a first mean particle size, and the second material is provided as a powder having a second mean particle size,
a distribution of the first mean particle size and the second mean particle size varies across the first repair zone in a thickness direction,
if the first mean particle size is smaller than the second mean particle size, then, for the same volume of material, a time required to melt the first material will be less than a time required to melt the second material, and
if the second mean particle size is smaller than the first mean particle size, then, for the same volume of material, the time required to melt the second material will be less than the time required to melt the first material.

13. The metallic component as claimed in claim 12, wherein the integer 'n' is in a range of 10 to 1,000.

14. The metallic component as claimed in claim 12, wherein a ratio A/B is in a range of 80/20 to 5/95.

15. The metallic component as claimed in claim 12, wherein a ratio C/D is in a range of 0/100 to 40/60.

16. The metallic component as claimed in claim 12, wherein the change in the proportion of the second material in the mixture comprises an increase in the proportion of the second material in the mixture.

17. The metallic component as claimed in claim 12, further comprising a second repair zone superposed on the first repair zone, the second repair zone comprising a plurality of second repair layers of the second material.

18. The metallic component as claimed in claim 17, further comprising a third repair zone superposed on the second repair zone, the third repair zone comprising a plurality of third repair layers of a third material.

* * * * *